(12) United States Patent
Tseng et al.

(10) Patent No.: US 9,466,438 B2
(45) Date of Patent: Oct. 11, 2016

(54) TOUCH PANEL AND MANUFACTURING METHOD THEREOF

(71) Applicant: TPK Touch Solutions (Xiamen) Inc., Xiamen (CN)

(72) Inventors: Chan-Hao Tseng, Kaohsiung (TW); Hsien-Jung Li, Tainan (TW); Cheng-Chung Chiang, Tainan (TW)

(73) Assignee: TPK TOUCH SOLUTIONS (XIAMEN) INC., Xiamen (CN)

( * ) Notice: Subject to any disclaimer, the term of this patent is extended or adjusted under 35 U.S.C. 154(b) by 130 days.

(21) Appl. No.: 13/969,619

(22) Filed: Aug. 19, 2013

(65) Prior Publication Data

US 2014/0054149 A1 Feb. 27, 2014

(30) Foreign Application Priority Data

Aug. 26, 2012 (CN) .......................... 2012 1 0319119

(51) Int. Cl.
| | | |
|---|---|---|
| *G06F 3/045* | (2006.01) | |
| *H01H 1/64* | (2006.01) | |
| *H01H 11/04* | (2006.01) | |
| *G06F 3/044* | (2006.01) | |
| *H03K 17/96* | (2006.01) | |

(52) U.S. Cl.
CPC ............... *H01H 1/64* (2013.01); *G06F 3/044* (2013.01); *H01H 11/04* (2013.01); *H03K 17/9622* (2013.01); *G06F 2203/04103* (2013.01); *G06F 2203/04111* (2013.01); *H03K 2217/960755* (2013.01); *Y10T 29/49105* (2015.01)

(58) Field of Classification Search
CPC ...... G06F 3/041; G06F 3/044; G06F 3/0414; G06F 2203/04103; G06F 2203/04111

USPC .................................. 345/87–100, 173–178; 178/18.01–18.07, 20.01–20.04
See application file for complete search history.

(56) References Cited

U.S. PATENT DOCUMENTS

| | | | | |
|---|---|---|---|---|
| 8,564,558 | B2 * | 10/2013 | Yi et al. .......................... | 345/173 |
| 2007/0195029 | A1 * | 8/2007 | Jeon et al. ...................... | 345/87 |
| 2009/0174681 | A1 * | 7/2009 | Chang et al. .................. | 345/173 |
| 2010/0171718 | A1 * | 7/2010 | Denda ............................ | 345/173 |
| 2010/0295819 | A1 * | 11/2010 | Ozeki et al. ................... | 345/174 |
| 2011/0128240 | A1 * | 6/2011 | Choi .............................. | 345/173 |
| 2012/0050186 | A1 | 3/2012 | Yi et al. | |
| 2012/0182250 | A1 | 7/2012 | Nagata et al. | |

FOREIGN PATENT DOCUMENTS

| | | |
|---|---|---|
| CN | 201078769 | 6/2008 |
| TW | 200842681 | 11/2008 |

* cited by examiner

*Primary Examiner* — Vijay Shankar
(74) *Attorney, Agent, or Firm* — Cooper Legal Group, LLC

(57) ABSTRACT

The present invention provides a touch panel. The touch panel includes first sensing lines extending in a first direction, second sensing lines extending in a second direction and intersecting with the first sensing lines, an insulating pad disposed at each intersection between the first sensing lines and the second sensing lines for isolating the first sensing lines and the second sensing lines. A direction of an external force exerted in the insulating pad is non-perpendicular to the edge of said insulating pad on the same horizontal plane. The present invention also provides a manufacturing method of the touch panel. The design of the insulating pad can disperse the external impact force caused by air knife, washing and so on, and preventing the cut-off of the insulating pad, thereby improving the yield of the touch panel.

27 Claims, 5 Drawing Sheets

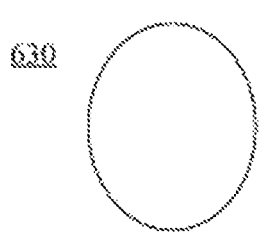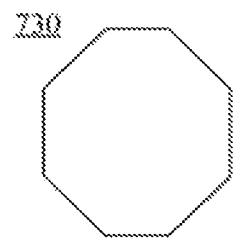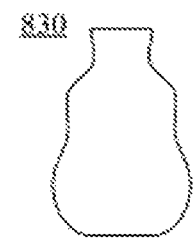
FIG. 6  FIG. 7  FIG. 8
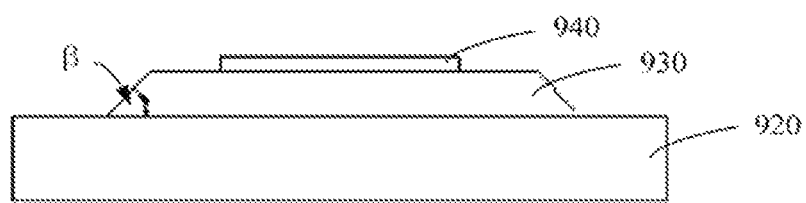
FIG. 9

TOUCH PANEL AND MANUFACTURING METHOD THEREOF

BACKGROUND OF THE INVENTION

This Application claims priority of the People's Republic of China Patent Application No. 201210319119.6, filed on Aug. 26, 2012, the entirety of which is incorporated herein by reference.

1. Field of the Invention

The present invention relates generally to a touch technology, and more particularly, to a touch panel and a manufacturing method thereof.

2. Description of the Prior Art

Touch panels are widely used in the I/O interface of electronic products, like game consoles, smart phones, and tablets.

A touch panel generally includes a wiring board, a sensing electrode layer disposed on the wiring board, a wiring layer and a protection layer, etc, wherein the sensing electrode layer is generally a sensing array composed of multiple column electrodes and row electrodes which are intersected with each other. The column electrodes are isolated from the row electrodes by insulating pads at the intersection of each column electrode and row electrode to prevent the occurrence of short circuits at the intersections. The manufacturing process of the touch panel includes cleaning processes, such as air knife or washing. During the cleaning processes, each insulating pad is suffered an external force of the air knife or the washing solution on the same horizontal plane. Since the force direction exerted in the insulating pad is perpendicular to the edge of the rectangular insulating pad, the external force may not be effectively dispersed by the edge. The rectangular insulating pad, therefore, is prone to suffer crack issues.

Accordingly, it is necessary to provide a touch panel having insulating pads with a high anti-impacting ability to solve the issue of the broken insulating pads and improve the yield of the touch panel process.

SUMMARY OF THE INVENTION

The present invention provides a touch panel including a first sensing line extending in a first direction, a second sensing line extending in a second direction and intersecting with the first sensing line, and an insulating pad disposed at the intersection of the first sensing line and the second sensing line for isolating the first sensing line from the second sensing line, wherein an direction of an external force exerted in the insulating pad is non-perpendicular to the edge of the insulating pad on the same horizontal plane.

In one of the embodiments, the insulating pad is provided with at least one extension portion protruding from the center of the insulating pad in the first direction, and/or the insulating pad is provided with at least another extension portion protruding from the center of the insulating pad in a direction opposite to the first direction.

In one of the embodiments, the first sensing line includes a plurality of first electrodes and a plurality of first conductive lines electrically connecting with adjacent first electrodes, and the second sensing line includes a plurality of second electrodes and a plurality of second conductive lines electrically connecting with adjacent second electrodes. The first electrodes, the second electrodes, and the first conductive lines are disposed on the same plane. In one of the embodiments, the insulating pad is provided with through-holes, and two ends of the second conductive line are respectively coupled with two second electrodes through the through-holes formed in the insulating pad.

In one of the embodiments, the insulating pad is a non-rectangular insulating pad.

In one of the embodiments, the shape of the insulating pad is hexagonal, rhombus, oval, octagonal, or gourd-shaped. In one of the embodiments, the interior angle of the extension portion of the hexagonal insulating pad is larger than 90°.

In one of the embodiments, the length of the hexagonal insulating pad in the first direction is in a range of 200 μm to 500 μm, and the length of the hexagonal insulating pad in the second direction is in a range of 300 μm to 700 μm.

In one of the embodiments, the thickness of the insulating pad is in a range of 1.1 μm to 1.9 μm.

In one of the embodiments, the lateral surface of the insulating pad is an inclined plane.

In one of the embodiments, the inclined angle of the inclined plane is in a range of 30° to 80°.

In another embodiment, a method for manufacturing the above-identified touch panel is provided, including the steps of:

forming a plurality of first electrodes extending in a first direction, a plurality of first conductive lines electrically connecting adjacent said first electrodes, and a plurality of second electrodes extending in a second direction on a wiring board; forming an insulating pad on each first conductive line, wherein an direction of an external force exerted in the insulating pad is non-perpendicular to the edge of the insulating pad on the same horizontal plane; and forming a second conductive line electrically connecting with adjacent second electrodes on each insulating pad.

In one of the embodiments, the insulating pad is provided with at least one extension portion protruding from the center of the insulating pad in the first direction, and/or the insulating pad is provided with at least another extension portion protruding from the center of the insulating pad in a direction opposite to the first direction.

For the touch panel provided in the present invention, the edge of the improved insulating pad is non-perpendicular to the direction of the external force exerted in the insulating pad on the same horizontal plane. The improved insulating pad may effectively disperse the external force through the edge thereof in the process, thereby enhancing the anti-impacting ability of the insulating pad. In addition, the design further improves the yield of the touch panel process.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles.

In the drawings:

FIG. 6 is a schematic view depicting an insulating pad in accordance with the fifth embodiment of the present utility model;

FIG. 7 is a schematic view depicting an insulating pad in accordance with the sixth embodiment of the present utility model;

FIG. 8 is a schematic view depicting an insulating pad in accordance with the seventh embodiment of the present utility model; and FIG. 9 is a side view depicting the structure of an insulating pad in accordance with the present utility model.

Figure 1:
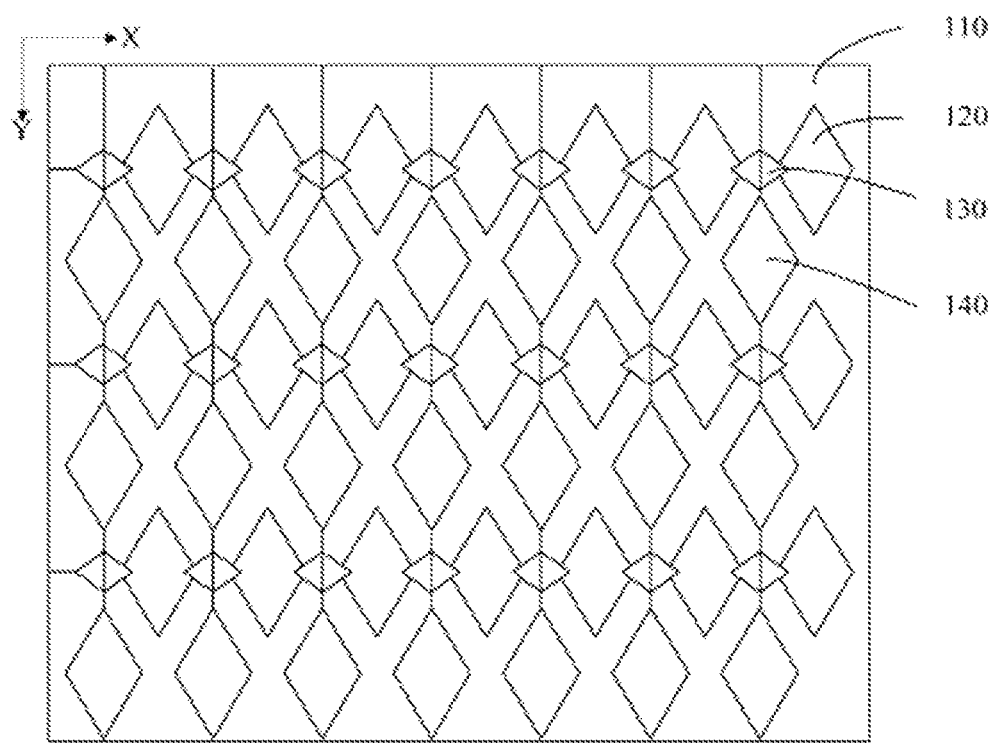
FIG. 1 is a plane view depicting a touch panel in accordance with the first embodiment of the present utility model.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION OF THE INVENTION

As shown in FIG. 1, a first direction X and a second direction Y are defined on a touch panel. Preferably, the first direction X is perpendicular to the second direction Y. The touch panel includes a plurality of first sensing lines 120 extending in the first direction X, a plurality of insulating pads 130, and a plurality of second sensing lines 140 extending in the second direction Y. The touch panel further includes a wiring board 110. The wiring board 110 in the present invention may be a conventional touch panel using a transparent glass substrate or a plastic substrate to support and/or protect the components formed thereon, such as the first sensing lines 120, the insulating pads 130, and the second sensing lines 140. The first sensing lines 120 are disposed on the wiring board 110 and intersect with the second sensing lines 140. The insulating pad 130 is disposed at each intersection of the first sensing lines 120 and the second sensing lines 140 for isolating the first sensing line 120 from the second sensing line 140, wherein an direction of an external force (ex. air knife or washing) exerted in the insulating pad 130 is non-perpendicular to the edge of the insulating pad 130 on the same horizontal plane. This non-perpendicular configuration may help dispersing the impact force exerted on the single edge of the insulating pad 130 in the process, for example, the force impacting on the insulating pad in the first direction X or in the direction opposite to the first direction, thereby enhancing the anti-impacting ability of the insulating pad 130 and preventing the crack of the insulating pads, and improving the yield of the touch panel process.

The insulating pad may be a non-rectangular insulating pad, or the insulating pad may have an extension portion protruding along the first direction X and another extension portion protruding along the direction opposite to the first direction X from the center of the insulating pad. Detailed structures of the insulating pad and the touch panel with different aspects will be disclosed hereinafter with several corresponding embodiments.

Figure 2:
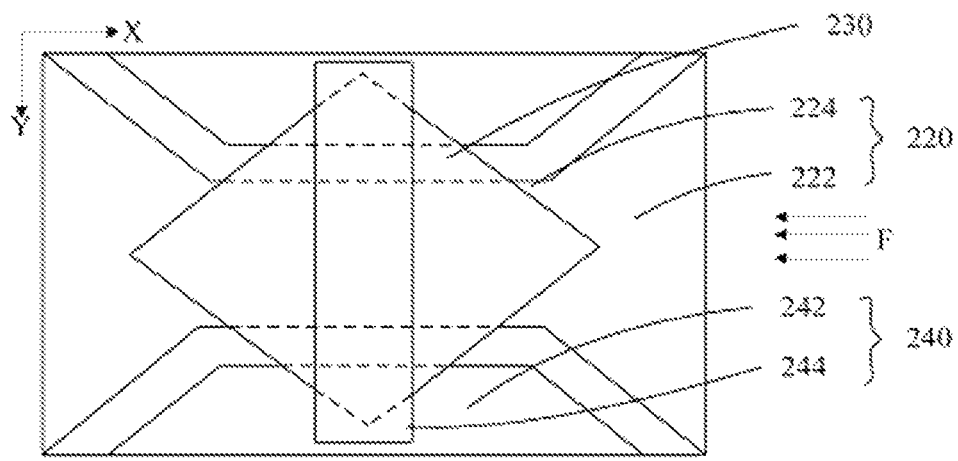
FIG. 2 is a top view schematically depicting the structure of an insulating pad in accordance with the first embodiment of the present utility model.

Referring to FIG. 2, a structure that may be used in the touch panel shown in FIG. 1 is depicted. In this embodiment, the first sensing line 220 includes a plurality of first electrodes 222 and a plurality of first conductive lines 224 electrically connecting the first electrodes 222. The second sensing line 240 includes a plurality of second electrodes 242 and a plurality of second conductive lines 244 electrically connecting the second electrodes 242. The second conductive lines 244 may be made of metal material or indium tin oxides (ITO). Insulating pads 230 are disposed at the intersection of the first conductive lines 224 and the second conductive lines 244 for isolating the first conductive lines 224 from the second conductive lines 244. In this embodiment, the length of the second conductive line 244 is larger than the length of the insulating pad 230, and the two ends of the second conductive line 244 are directly connected with two adjacent second electrodes 242. The insulating pad 230 may be a rhombus-shaped insulating pad. The rhombus-shaped insulating pad 230 has an extension portion protruding along the first direction X. The design of the extension portion in the insulating pad 230 provides the multiple edges for dispersing the impact forces (denoted as F in FIG. 2) of the air knife or washing and preventing the cut-off of the insulating pad. In this embodiment, the rhombus insulating pad 230 is also provided with another extension portion protruding along the direction opposite to the first direction X. Through the design of the rhombus insulating pad having extension portions at both sides, the impact force in different directions may be readily dispersed.

Figure 3:
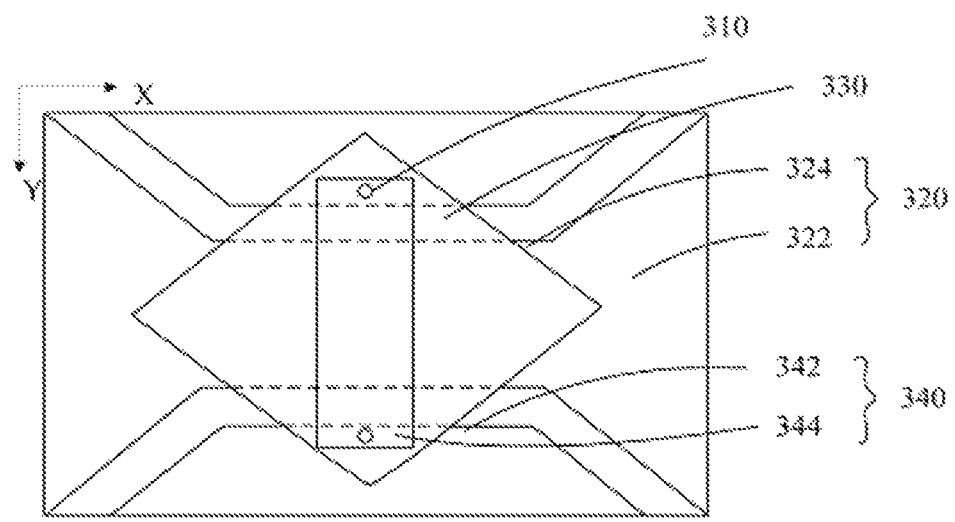
FIG. 3 is a top view depicting the structure of an insulating pad in accordance with the second embodiment of the present utility model.

Referring to FIG. 3, another structure which may be used in the touch panel shown in FIG. 1 is depicted. In this embodiment, the first sensing line 320 includes a plurality of first electrodes 322 and a plurality of first conductive lines 324 electrically connecting two adjacent first electrodes 322, and the second sensing line 320 includes a plurality of second electrodes 342 and a plurality of second conductive lines 344 electrically connecting two adjacent second electrodes 342. The second conductive lines 344 may be made of metallic materials or ITO. The insulating pad 330 is disposed at the intersection of the first conductive line 324 and the second conductive line 344 for isolating the first conductive line 324 from the second conductive line 344. In this embodiment, the length of the second conductive line 344 is smaller than the length of the insulating pad 330, and the two ends of the second conductive line are coupled with the two second electrodes 342 through the through-holes 310 formed in the insulating pad 330. The insulating pad 330 may be a rhombus insulating pad with the same features or functionalities as the one shown in FIG. 2. Repetitious details will, therefore, not be described herein again.

Figure 4:
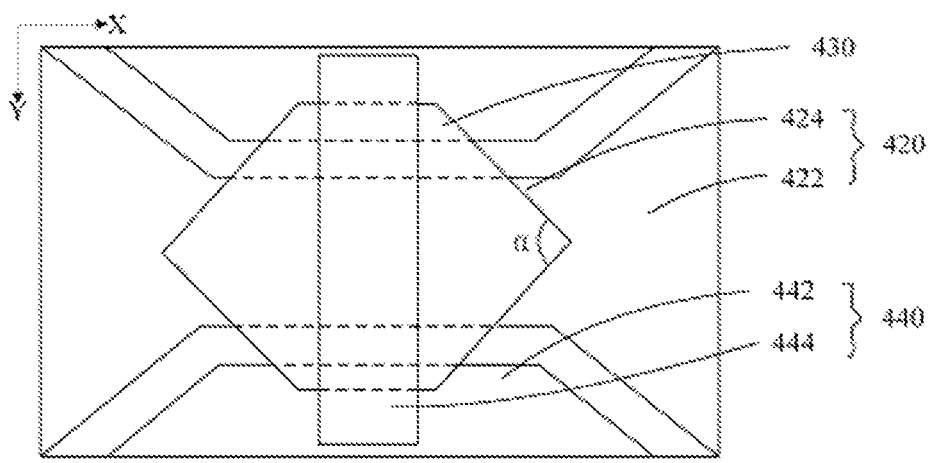
FIG. 4 is a top view depicting the structure of an insulating pad in accordance with the third embodiment of the present utility model.

Referring to FIG. 4, still another structure that may be used in the touch panel shown in FIG. 1 is depicted. In this embodiment, the first sensing line 420 includes a plurality of first electrodes 422 and a plurality of first conductive lines 424 electrically connecting two adjacent first electrodes 422, and the second sensing line 440 includes a plurality of second electrodes 442 and a plurality of second conductive line 444 electrically connecting two adjacent second electrodes 442. The second conductive line 444 may be made of metallic materials or ITO. The insulating pad 430 is disposed at the intersection of the first conductive line 424 and the second conductive line 444 for isolating the first conductive line 424 from the second conductive line 444. In this embodiment, the length of the second conductive line 444 is larger than the length of the insulating pad 430, and the two ends of the second conductive line 444 is directly connected with the two second electrodes 442. The insulating pad 430 is a hexagonal insulating pad. In this embodiment, the hexagonal insulating pad 430 is provided with an extension portion protruding along the first direction X and another extension portion protruding along the direction opposite to the first direction X. The design of the hexagonal insulating pad having extension portions at both sides can disperse the impact forces in different directions.

Figure 5:
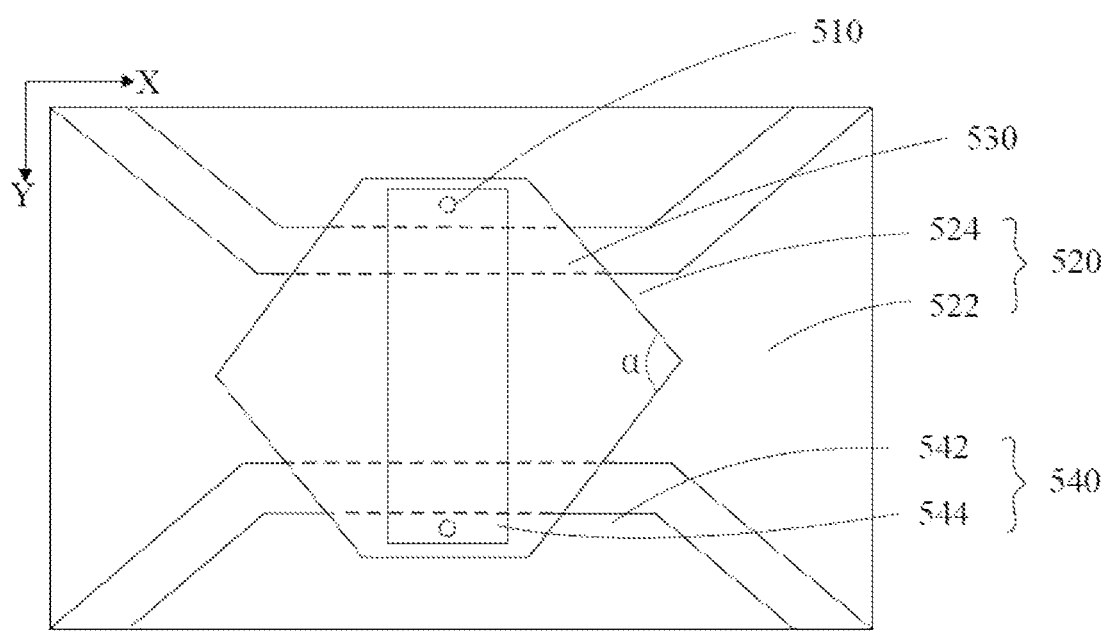
FIG. 5 is a top view depicting the structure of an insulating pad in accordance with the fourth embodiment of the present utility model.

Referring to FIG. 5, still another structure that may be used in the touch panel shown in FIG. 1 is depicted. In this embodiment, the first sensing line 520 includes a plurality of first electrodes 522 and a plurality of first conductive lines 524 electrically connecting the two adjacent first electrodes 522, and the second sensing line 540 includes a plurality of second electrodes 542 and a plurality of second conductive lines 544 connecting two adjacent second electrodes 542. The second conductive line 544 may be made of metallic materials or ITO. The insulating pad 530 is disposed at the intersection of the first conductive line 524 and the second conductive line 544 for isolating the first conductive line 524 from the second conductive line 544. In this embodiment, the length of the second conductive line 544 is smaller than the length of the insulating pad 530, and the two ends of the second conductive line 544 couple respectively with the two second electrodes 542 through the through-holes 510 formed in the insulating pad 530. The insulating pad 530 is a hexagonal insulating pad. In this embodiment, the hexagonal insulating pad 530 is provided with an extension portion protruding along the first direction X as well as another extension portion protruding along the direction opposite to the first direction X. The design of the hexagonal insulating pad having extension portions at both sides can disperse the impact forces in different directions.

In one embodiment, the interior angle α of the hexagonal insulating pad 430 or the extension portion of the hexagonal insulating pad 530 is larger than 90°. The design of the interior angle α larger than 90° may ensure that the extension portion of the hexagonal insulating pad protrudes out of the center of the insulating pad along the first direction to disperse the impact of the external forces effectively.

In above embodiment, the length of the hexagonal insulating pad 430 or 530 in the first direction X is in a range of 200 μm to 500 μm, and the length of the hexagonal insulating pad 430 or 530 in the second direction Y is in a range of 300 μm to 700 μm. The hexagonal insulating pad with this configuration may ensure better insulating effects between the conductive lines as well as not affect the formation of the second conductive lines 544, for example, the scale of the second conductive lines 544 is required to be longer or narrower.

The shape of the insulating pad is not limited to the examples shown in the embodiment above. Other exemplary variations of the insulating pad are shown in FIGS. 6-8, which is respectively the oval, octagonal, and gourd-shaped insulating pads 630, 730 and 830.

In one embodiment, as shown in FIG. 9, the lateral surface of the insulating pad 930 is an inclined plane. The insulating pad 930 is disposed at the intersection of the first sensing line 920 and the second sensing line 940. The angle β between the inclined plane and the plane with the first electrodes, the first sensing line 920 of the first conductive line is in a range of 30° to 80°. The design of the inclined edge in the insulating pad can decrease the resistance at the edges of the insulating pad when the external force exerts in the insulating pad.

In one embodiment, the thickness of the insulating pad is in a range of 1.1 μm to 1.9 μm. By configuring the thickness of the insulating pad within the above-identified range, not only the thickness of the touch panel may be maintained in the allowable range to facilitate the thinning of the touch panel, but also the sufficient strength for the insulating pads will be ensured.

In above embodiment, a plurality of first electrodes, a plurality of first conductive lines, and a plurality of second electrodes are disposed on the same plane, while a plurality of second conductive lines are disposed on the other plane. The first electrode, the second conductive line, and the second electrode may be made of the same materials, such as ITO, nano-silver, nanotube, etc. In the embodiment above, the material of the insulating pad may be a material with insulation property, such as epoxy.

Figure 10:
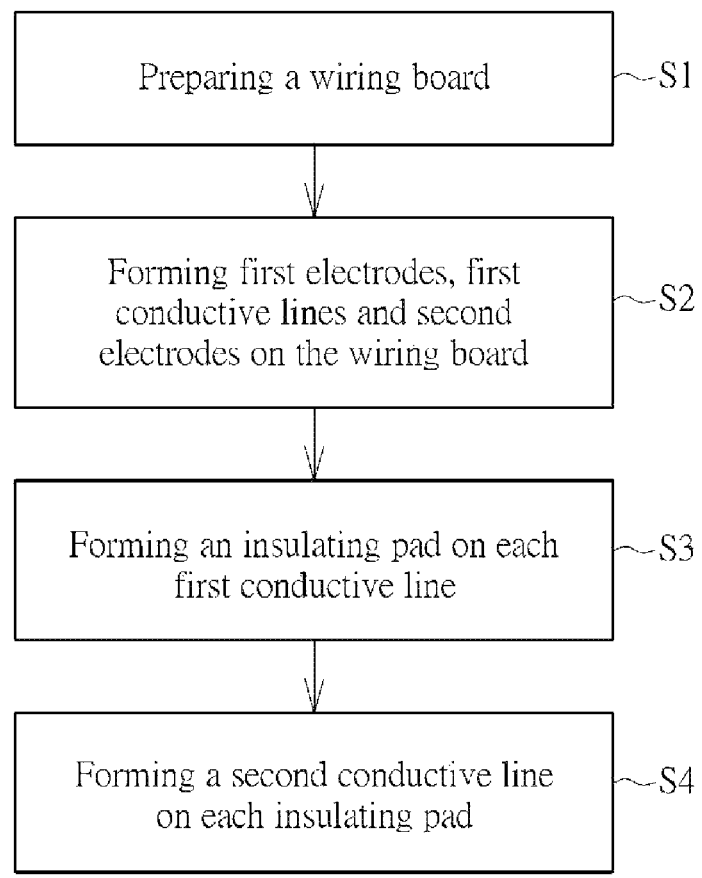
FIG. 10 is a flow chart of a manufacturing method for the touch panel in accordance with the fifth embodiment of the present utility model.

As shown in FIG. 10, the touch panel may be formed by following steps. Step 1: preparing a wiring board, more specifically, a wiring board with required specification and size. The wiring board is usually made of transparent glass or plastic. Use a cleaner to clean the surface of the wiring board to be processed and dry the wiring board.

Step 2: forming a plurality of first electrodes extending in a first direction, a plurality of first conductive lines electrically connecting the adjacent first electrodes, and a plurality of second electrodes extending in a second direction, wherein the first electrodes, the first conductive lines, and the second electrodes can be formed in the same time. In another embodiment, the first electrodes, the first conductive lines, and the second electrodes can be formed in the different time.

Step 3: forming an insulating pad on each first conductive line, wherein a direction of an external force exerted in the insulating pad is non-perpendicular to the edge of the insulating pad on the same horizontal plane. For example, the insulating pad may be a non-rectangular insulating pad, or the insulating pad has at least one extension portion protruding from the center of the insulating pad in the first direction.

Step 4: forming a second conductive line electrically connecting adjacent second electrodes on each insulating pad.

In one embodiment, for the step 3 of forming the insulating pad on the first conductive line, in addition to at least one extension portion protruding along the first direction from the center of the insulating pad, the insulating pad is further provided with at least another extension portion protruding along the direction opposite to the first direction from the center of the insulating pad.

In one embodiment, the thickness of the insulating pad is in a range of 1.1 μm to 1.9 μm. By configuring the thickness of the insulating pad within the above-identified range, not only the thickness of the touch panel may be maintained in the allowable range to facilitate the thinning of the touch panel, but also the sufficient strength for the insulating pads will be ensured.

In one embodiment, through-holes are formed in the insulating pad, and the two ends of the second conductive line respectively couple with two second electrodes through the through-holes formed in the insulating pad.

The lateral surface of the insulating pad is an inclined plane. The inclined angle β of the inclined plane is in a range of 30° to 80°. The design of the inclined edge of the insulating pad may prevent the issue of overlarge resistance at the edges of the insulating pad.

The shape of the insulating pad may be rhombus as shown in FIGS. 2 and 3, the hexagon shown in FIGS. 4 and 5, or the variations of oval, octagonal, and gourd-shaped as shown respectively in FIGS. 6-8.

The method of manufacturing a touch pad in the present invention provides an insulating pad with the edge non-perpendicular to the direction of the external force exerted in the insulating pad on the same plane. This non-perpendicular configuration may help dispersing the external force through the edge thereof in the process, thereby preventing the crack possibility of the insulating pads in the process and improving the yield of the touch panel process.

It is easy to understand that the above-identified insulating pad structure and the manufacturing method of the touch panel may be used in touch panel with the design requirement of isolating the intersecting conductors through the insulating pad.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A touch panel, comprising:
   a first sensing line extending in a first direction;
   a second sensing line extending in a second direction and intersecting with said first sensing line; and
   an insulating pad disposed at an intersection of said first sensing line and said second sensing line for isolating said first sensing line from said second sensing line, wherein said insulating pad comprises at least one edge non-perpendicular to an external force from a manufacturing process exerted on a horizontal plane in which said at least one edge is disposed;
   wherein said first sensing line comprises a plurality of first electrodes and a plurality of first conductive lines electrically connecting with adjacent said first electrodes, and said second sensing line comprises a plurality of second electrodes and a plurality of second conductive lines electrically connecting with adjacent said second electrodes, wherein said plurality of first electrodes, said plurality of second electrodes, and said plurality of first conductive lines are disposed on a same plane.

2. The touch panel according to claim 1, wherein said insulating pad is provided with at least one extension portion protruding from a center of said insulating pad in said first direction, and/or said insulating pad is provided with at least another extension portion protruding from said center of said insulating pad in a direction opposite to said first direction.

3. The touch panel according to claim 1, wherein said insulating pad is disposed at an intersection of a first conductive line of said plurality of first conductive lines and a second conductive line of said plurality of second conductive lines.

4. The touch panel according to claim 1, wherein said insulating pad is provided with through-holes and two ends of each of said second conductive lines are respectively coupled with two said second electrodes through said through-holes formed in said insulating pad.

5. The touch panel according to claim 1, wherein said insulating pad is a non-rectangular insulating pad.

6. The touch panel according to claim 1, wherein a shape of said insulating pad is hexagonal, rhombus, oval, octagonal, or gourd-shaped.

7. The touch panel according to claim 2, wherein a shape of said insulating pad is hexagonal, and an interior angle of at least one of said at least one extension portion or said at least another extension portion of said insulating pad is larger than 90°.

8. The touch panel according to claim 6, wherein a length of said insulating pad in said first direction is in a range of 200μm to 500μm, and a length of said insulating pad in said second direction is in a range of 300μm to 700μm.

9. The touch panel according to claim 1, wherein a thickness of said insulating pad is in a range of 1.1μm to 1.9μm.

10. The touch panel according to claim 1, wherein a lateral surface of said insulating pad is an inclined plane.

11. The touch panel according to claim 10, wherein an inclined angle of said inclined plane is in a range of 30° to 80°.

12. A method of manufacturing a touch panel, comprising the steps of:
    forming a plurality of first electrodes extending in a first direction, a plurality of first conductive lines electrically connecting with adjacent said first electrodes, and a plurality of second electrodes extending in a second direction, said plurality of first electrodes and said plurality of second electrodes on a same plane of a wiring board;
    forming an insulating pad on each said first conductive line, wherein said insulating pad comprises at least one edge non-perpendicular to an external force from a manufacturing process exerted on a horizontal plane in which the at least one edge is disposed; and
    forming a second conductive line electrically connecting with adjacent said second electrodes on said insulating pad.

13. The method of manufacturing a touch panel according to claim 12, wherein said insulating pad is provided with at least one extension portion protruding from a center of said insulating pad in said first direction, and/or said insulating pad is provided with at least another extension portion protruding from said center of said insulating pad in a direction opposite to said first direction.

14. The touch panel according to claim 3, wherein a length of each of said second conductive lines is larger than a length of said insulating pad along the second direction, and two ends of each of said second conductive lines are respectively directly connected with two adjacent second electrodes.

15. The touch panel according to claim 4, wherein a length of each of said second conductive lines is smaller than a length of said insulating pad along the second direction.

16. A touch panel, comprising:
    a first sensing line extending in a first direction;
    a second sensing line extending in a second direction and intersecting with said first sensing line; and
    an insulating pad disposed at an intersection of said first sensing line and said second sensing line for isolating said first sensing line from said second sensing line, wherein said insulating pad comprises at least one edge non-perpendicular to the first direction and the second direction;
    wherein said first sensing line comprises a plurality of first electrodes and a plurality of first conductive lines electrically connecting with adjacent said first electrodes, and said second sensing line comprises a plurality of second electrodes and a plurality of second conductive lines electrically connecting with adjacent said second electrodes, wherein said plurality of first electrodes, said plurality of second electrodes, and said plurality of first conductive lines are disposed on a same plane.

17. The touch panel according to claim 16, wherein a shape of said insulating pad is hexagonal, and wherein an interior angle of an extension portion of said insulating pad is larger than 90°.

18. The touch panel according to claim 16, wherein a shape of said insulating pad is hexagonal, and wherein a length of said insulating pad in said first direction is in a range of 200μm to 500μm, and a length of said insulating pad in said second direction is in a range of 300μm to 700μm.

19. The touch panel according to claim 16, wherein a thickness of said insulating pad is in a range of 1.1μm to 1.9μm.

20. The touch panel according to claim 16, wherein said insulating pad is disposed at an intersection of a first conductive line of said plurality of first conductive lines and a second conductive line of said plurality of second conductive lines.

21. The touch panel according to claim 20, wherein a length of each of said second conductive lines is larger than a length of said insulating pad along said second direction, and two ends of each of said second conductive lines are respectively directly connected with two adjacent second electrodes.

22. The touch panel according to claim 16, wherein said insulating pad is provided with through-holes and two ends of each of said second conductive lines are respectively coupled with two said second electrodes through said through-holes formed in said insulating pad.

23. The touch panel according to claim 22, wherein a length of each of said second conductive lines is smaller than a length of said insulating pad along the second direction.

24. The touch panel according to claim 16, wherein said insulating pad is a non-rectangular insulating pad.

25. The touch panel according to claim 16, wherein a shape of said insulating pad is rhombus, oval, octagonal, or gourd-shaped.

26. The touch panel according to claim 16, wherein a lateral surface of said insulating pad is an inclined plane.

27. The touch panel according to claim 26, wherein an inclined angle of said inclined plane is in a range of 30° to 80°.

* * * * *